US011485632B2

(12) United States Patent
Ros et al.

(10) Patent No.: US 11,485,632 B2
(45) Date of Patent: Nov. 1, 2022

(54) MODULAR 3-D PRINTED DEVICES FOR SAMPLE DELIVERY AND METHOD

(71) Applicant: ARIZONA BOARD OF REGENTS ON BEHALF OF ARIZONA STATE UNIVERSITY, Scottsdale, AZ (US)

(72) Inventors: Alexandra Ros, Phoenix, AZ (US); John Spence, Tempe, AZ (US); Diandra Doppler, Scottsdale, AZ (US); Garrett Nelson, Mesa, AZ (US); Richard Kirian, Tempe, AZ (US); Reza Nazari, Tempe, AZ (US); Ana Egatz-Gomez, Phoenix, AZ (US); Mukul Sonker, Tempe, AZ (US); Mohammad Rabbani, Tempe, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 17/497,675

(22) Filed: Oct. 8, 2021

(65) Prior Publication Data
US 2022/0112079 A1    Apr. 14, 2022

Related U.S. Application Data

(60) Provisional application No. 63/090,031, filed on Oct. 9, 2020.

(51) Int. Cl.
*B33Y 80/00* (2015.01)
*B81C 3/00* (2006.01)
*B81B 1/00* (2006.01)

(52) U.S. Cl.
CPC ............. *B81C 3/005* (2013.01); *B81B 1/008* (2013.01); *B33Y 80/00* (2014.12); *B81B 2201/057* (2013.01); *B81C 2203/054* (2013.01)

(58) Field of Classification Search
CPC ... B81C 3/005; B81C 2203/054; B81B 1/008; B81B 2201/057; B33Y 80/00
See application file for complete search history.

(56) References Cited

U.S. PATENT DOCUMENTS

| 5,105,843 A | 4/1992 | Condron et al. |
| 6,174,469 B1 | 1/2001 | Ganan-Calvo |

(Continued)

FOREIGN PATENT DOCUMENTS

| WO | WO2009091416 A2 | 7/2009 |
| WO | WO2011150368 A1 | 12/2011 |

(Continued)

OTHER PUBLICATIONS

Acero et al., "A new flow focusing technique to produce very thin jets," J. Micromech. Microeng., vol. 23, No. 6, p. 065009, 2013.

(Continued)

*Primary Examiner* — Rick K Chang
(74) *Attorney, Agent, or Firm* — Michael Best & Friedrich LLP

(57) ABSTRACT

A microfluidic device for use in a serial crystallography apparatus includes a modular 3D-printed nozzle having an inlet, an outlet, and a first snap engagement feature. The microfluidic device further includes a modular 3D-printed fiber holder having an outlet and a second snap engagement feature. The first snap engagement feature is configured to engage the second snap engagement feature to removably couple the nozzle to the fiber holder. The outlet of the fiber holder is aligned with the inlet of the nozzle when the first snap engagement feature is coupled to the second snap engagement feature.

20 Claims, 7 Drawing Sheets

(56) References Cited

U.S. PATENT DOCUMENTS

| | | | |
|---|---|---|---|
| 6,221,654 | B1 | 4/2001 | Quake et al. |
| 6,822,180 | B2 | 11/2004 | Fujii et al. |
| 6,976,590 | B2 | 12/2005 | Deshpande et al. |
| 7,341,211 | B2 | 3/2008 | Ganan Calvo et al. |
| 7,584,857 | B2 | 9/2009 | Böhm et al. |
| 7,708,949 | B2 | 5/2010 | Stone et al. |
| 8,272,576 | B2 | 9/2012 | Doak et al. |
| 8,658,367 | B2 | 2/2014 | Quake et al. |
| 8,827,548 | B2 | 9/2014 | Roukes et al. |
| 8,844,570 | B2 | 9/2014 | Glick |
| 9,038,919 | B2 | 5/2015 | Link et al. |
| 9,126,365 | B1* | 9/2015 | Mark .................. B29B 15/12 |
| 9,192,944 | B2 | 11/2015 | Ros et al. |
| 9,227,200 | B2 | 1/2016 | Chiou et al. |
| 9,289,787 | B2 | 3/2016 | Doak et al. |
| 9,387,488 | B2 | 7/2016 | Chou et al. |
| 9,446,360 | B2 | 9/2016 | Mazutis |
| 9,643,136 | B2 | 5/2017 | Hansen et al. |
| 9,839,922 | B2 | 12/2017 | Doak et al. |
| 10,166,542 | B2 | 1/2019 | Ros et al. |
| 10,413,920 | B2 | 9/2019 | Doak et al. |
| 10,557,807 | B2 | 2/2020 | Ros et al. |
| 11,173,487 | B2 | 11/2021 | Ros et al. |
| 2007/0003442 | A1 | 1/2007 | Link et al. |
| 2007/0012891 | A1 | 1/2007 | Maltezos et al. |
| 2007/0080062 | A1 | 4/2007 | Harnett et al. |
| 2007/0228049 | A1 | 10/2007 | Nordmeyer et al. |
| 2008/0105565 | A1 | 5/2008 | Davalos et al. |
| 2009/0235990 | A1 | 9/2009 | Beer |
| 2010/0163116 | A1 | 7/2010 | Fang et al. |
| 2010/0196892 | A1 | 8/2010 | Quake et al. |
| 2010/0224255 | A1 | 9/2010 | Mathies et al. |
| 2010/0224493 | A1 | 9/2010 | Davalos et al. |
| 2010/0303687 | A1 | 12/2010 | Blaga et al. |
| 2012/0021523 | A1 | 1/2012 | Fowler et al. |
| 2012/0085649 | A1 | 4/2012 | Sano et al. |
| 2012/0266986 | A1 | 10/2012 | Wimberger-Friedl et al. |
| 2013/0032235 | A1 | 2/2013 | Johnstone et al. |
| 2013/0295653 | A1 | 11/2013 | Quake et al. |
| 2013/0308756 | A1 | 11/2013 | Bogan et al. |
| 2013/0313336 | A1 | 11/2013 | Doak et al. |
| 2014/0038279 | A1 | 2/2014 | Ingber et al. |
| 2014/0091012 | A1 | 4/2014 | Ros et al. |
| 2014/0263693 | A1 | 9/2014 | Doak et al. |
| 2014/0295572 | A1 | 10/2014 | Fraden et al. |
| 2015/0087559 | A1 | 3/2015 | Putnam et al. |
| 2016/0030658 | A1 | 2/2016 | van der Merwe et al. |
| 2016/0051995 | A1 | 2/2016 | Weierstall et al. |
| 2016/0129443 | A1 | 5/2016 | Tovar et al. |
| 2016/0151784 | A1 | 6/2016 | Chiou et al. |
| 2016/0341675 | A1 | 11/2016 | Doak et al. |
| 2016/0370306 | A1 | 12/2016 | Comad et al. |
| 2017/0297024 | A1 | 3/2017 | Ros et al. |
| 2017/0274380 | A1 | 9/2017 | Weierstall et al. |
| 2018/0154380 | A1 | 6/2018 | Doak et al. |
| 2019/0134631 | A1 | 5/2019 | Ros et al. |
| 2019/0178822 | A1 | 6/2019 | Ros et al. |
| 2019/0184395 | A1 | 6/2019 | Ros et al. |
| 2019/0224689 | A1 | 7/2019 | Ros et al. |
| 2019/0248065 | A1* | 8/2019 | Gorin .................. B33Y 80/00 |
| 2020/0360944 | A1 | 11/2020 | Ros et al. |
| 2020/0363348 | A1 | 11/2020 | Ros et al. |
| 2021/0001359 | A1* | 1/2021 | Kirian .................. B05B 7/066 |

FOREIGN PATENT DOCUMENTS

| | | |
|---|---|---|
| WO | WO2013075081 A2 | 5/2013 |
| WO | WO2014151231 A1 | 9/2014 |
| WO | WO2016044545 A1 | 3/2016 |
| WO | WO2016164562 A1 | 10/2016 |
| WO | WO2017003725 A1 | 1/2017 |
| WO | WO2018013685 A1 | 1/2018 |
| WO | WO2018217793 A1 | 11/2018 |
| WO | WO2018217831 A1 | 11/2018 |

OTHER PUBLICATIONS

Akthakul A. et al., "Size fractionation of metal nanoparticles by membrane filtration", Advanced Materials, vol. 17, Issue 5, pp. 532-535 (2005).

Almen M.S. et al., "Mapping the human membrane proteome: a majority of the human membrane proteins can be classified according to function and evolutionary origin", BMC Biology, vol. 7, Issue 1, pp. 50 (2009).

Beech et al., "Tipping the balance of deterministic lateral displacement devices using dielectrophoresis," Lab Chip, 2009, 9:2698-2706.

Bhattacharya S. et al., "Insulator-based dielectrophoretic single particle and single cancer cell trapping", Electrophoresis, vol. 32, Issue 18, pp. 2550-2558 (2011).

Bligh M. et al., "Sorting microparticles into lateral streams using a two-phase rectangular electrokinetic array", Journal of Micromechanics and Microengineering, vol. 18, Issue 4, pp. 045002 (2008).

Boekema E.J. et al., "Evidence for a trimeric organization of the photosystem I complex from the thermophilic cyanobacterium *Synechococcus* sp.", FEBS Letters, vol. 217, Issue 2, pp. 283-286 (1987).

Bogunovic et al., Particle sorting by a structured microfluidic ratchet device with tunable selectivity: theory and experiment. Soft Matter 2012, 8 (14), 3900-3907.

Boutet S. et al., "High-Resolution Protein Structure Determination by Serial Femtosecond Crystallography", Science, vol. 337, Issue 6092, pp. 362-364 (2012).

Braschler et al., "Continuous separation of cells by balanced dielectrophoretic forces at multiple frequencies," Lab on a Chip, 2008, 8, 280-286.

Calzolai L. et al., "Separation and characterization of gold nanoparticle mixtures by flow-field-flow fractionation", Journal of Chromatography A, vol. 1218, Issue 27, pp. 4234-4239 (2011).

Cesaro-Tadic et al., High-sensitivity miniaturized immunoassays for tumor necrosis factor a using microfluidic systems. Lab on a Chip 2004, 4 (6), 563-569.

Chapman H. N. et al., "Femtosecond X-ray protein nanocrystallography", Nature-London, vol. 470, Issue 7332, pp. 73-77 (2011).

Chapman H.N., "X-ray imaging beyond the limits", Nature Materials, vol. 8, Issue 4, pp. 299-301 (2009).

Chen G. et al., "High-Purity Separation of Gold Nanoparticle Dimers and Trimers", Journal of the American Chemical Society, vol. 131, Issue 12, pp. 4218-4219 (2009).

Cheng I.F. et al., "A continuous high-throughput bioparticle sorter based on 3D traveling-wave dielectrophoresis", Lab on a chip, vol. 9, Issue 22. pp. 3193-3201 (2009).

Chinen et al., Nanoparticle Probes for the Detection of Cancer Biomarkers, Cells, and Tissues by Fluorescence. Chemical Reviews 2015, 115 (19), 10530-10574.

Chung et al., Ultrastructural changes of mitochondria in the skeletal muscle of patients with amyotrophic lateral sclerosis. Ultrastruct Pathol 2002, 26 (1), 3-7.

Cordelières, "Manual Tracking," ImageJ plugin, 2005, <https://imagej-nihgov.ezproxy1.lib.asu.edu/ij/plugins/track/track.html> 3 pages.

Cummings E.B. et al., "Dielectrophoresis in Microchips Containing Arrays of Insulating Posts: Theoretical and Experimental Results", Analytical Chemistry, vol. 75, Issue 18, pp. 4724-4731 (2003).

Davalos et al., "Performance impact of dynamic surface coatings on polymeric insulator-based dielectrophoretic particle separators," Anal. Bioanal. Chem. 2008, 390, 847-855.

Deponte, D. P., et al. "Gas Dynamic Virtual Nozzle for Generation of Microscopic Droplet Streams," J. Phys. D. Appl. Phys. 2008, 41, 195505, 7.

Dertinger S.K.W. et al., "Generation of Gradients Having Complex Shapes Using Microfluidic Networks", Anal. Chem., 73, 1240-1246 (2001).

Devaraju, N. et al., "Pressure driven digital logic in PDMS based microfluidic devices fabricated by multilayer soft lithography", Lab on a Chip, Nov. 2012, vol. 12, No. 22, pp. 4809-4815 <DOI:10.1039/c21c21155f>.

(56) References Cited

OTHER PUBLICATIONS

Doak R.B. et al., "Microscopic linear liquid streams in vacuum: Injection of solvated biological samples into X-ray free electron lasers", AIP Conference Proceedings, vol. 1501, pp. 1314-1323 (2012).

Drews et al., Ratcheted electrophoresis for rapid particle transport. Lab on a Chip 2013, 13 (22), 4295-4298.

Duffy et al., "Determination of Properties of Individual Liposomes by Capillary Electrophoresis with Postcolumn Laser-Induced Fluorescence Detection," Anal. Chem. 2001, 73, 1855-1861.

Eguchi et al., Giant mitochondria in acute lymphocytic leukemia. Exp Mol Pathol 1987, 47(1), 69-75.

Fernandez-Vizarra et al., Isolation of biogenetically competent mitochondria from mammalian tissues and cultured cells. Methods 2002, 26 (4), 292-297.

Fiedler S. et al., "Dielect rophoretic Sorting of Particles and Cells in a Microsystem", Analytical Chemistry, vol. 70, Issue 9, pp. 1909-1915 (1998).

Fromme P et al., "Improved isolation and crystallization of Photosystem I for structural analysis", Biochimica et Biophysica Acta, vol. 1365, Issue 1-2, pp. 175-184 (1998).

Fromme P. et al., "Femtosecond nanocrystallography using X-ray lasers for membrane protein structure determination", Current Opinion in Structural Biology, vol. 21, Issue 4, pp. 509-516 (2011).

Gan et al., "Six Helix Bundle and Triangle DNA Origami Insulator-Based Dielectrophoresis," Anal. Chem. 2013, 85, 11427-11434.

Gañán-Calvo et al., "Liquid Capillary Micro/Nanojets in Free-Jet Expansion," Small, vol. 6, No. 7, pp. 822-824, Apr. 2010.

Gascoyne P.R. et al., "Particle separation by dielectrophoresis", Electrophoresis, vol. 23, Issue 13, pp. 1973-1983 (2002).

Gerion D. et al., "Sorting Fluorescent Nanocrystals with DNA", Journal of the American Chemical Society, vol. 124, Issue 24, pp. 7070-7074 (2002).

Giddings, "Unified Separation Science," Wiley ; New York 1991.

Gonzalez et al., Gonzalez, C. F.; Remcho, V. T., Fabrication and evaluation of a ratchet type dielectrophoretic device for particle analysis. Journal of Chromatography A 2009, 1216 (52), 9063-9070.

Gorre-Talini et al., Dielectrophoretic ratchets. Chaos 1998, 8(3), 650-656.

Green N.G. et al., "Dielectrophoresis of Submicrometer Latex Spheres. 1. Experimental Results", Journal of Physical Chemistry B, vol. 103, Issue 1, pp. 41-50 (1999).

Hanggi et al., Artificial Brownian motors: Controlling transport on the nanoscale. Reviews of Modern Physics 2009, 81 (1), 387-442.

Heffner et al., The early effects of ischemia upon skeletal muscle mitochondria. J Neurol Sci 1978, 38 (3), 295-315.

Hellmich W. et al., "Poly (oxyethylene) Based Surface Coatings for Poly (dimethylsiloxane) Microchannels", Langmuir, vol. 21, Issue 16, pp. 7551-7557 (2005).

Holmes D. et al., "On-chip high-speed sorting of micron-sized particles for high-throughput analysis", IEE proceedings. Nanobiotechnology, vol. 152, Issue 4, pp. 129-135 (2005).

Holzel et al., "Trapping Single Molecules by Dielectrophoresis," Phys. Rev. Lett. 2005, 95, 128102.

Hornig-Do et al., "Isolation of functional pure mitochondria by superparamagnetic microbeads," Anal. Biochem. 2009, 389, 1-5.

Huang et al., "Current-monitoring method for measuring the electroosmotic flow rate in capillary zone electrophoresis," Anal. Chem. 1988, 60, 1837-1838.

Hunter M.S. et al., "Toward structure determination using membrane-protein nanocrystals and microcrystals", Methods, vol. 55, Issue 4, pp. 387-404 (2011).

Hunter M.S. et al., "X-ray Diffraction from Membrane Protein Nanocrystals", Biophysical Journal, vol. 100, Issue 1, pp. 198-206 (2011).

International Preliminary Report on Patentability for Application No. PCT/US2017/041708 dated Jan. 24, 2019, 8 pages.

International Preliminary Report on Patentability for Application No. PCT/US2018/033989 dated Dec. 5, 2019, 7 pages.

International Search Report and Written Opinion for Application No. PCT/US2015/050616 dated Jan. 18, 2016, 11 pages.

International Search Report and Written Opinion for Application No. PCT/US2017/041708 dated Oct. 23, 2017, 9 pages.

International Search Report and Written Opinion for Application No. PCT/US2018/033944 dated Sep. 26, 2018, 14 pages.

International Search Report and Written Opinion for Application No. PCT/US2018/033989 dated Jul. 20, 2018, 13 pages.

Jeon N.L. et al., "Generation of Solution and Surface Gradients Using Microfluidic Systems", Langmuir, 16, 8311-8316 (2000).

Jones et al., "Continuous Separation of DNA Molecules by Size Using Insulator-Based Dielectrophoresis," Anal. Chem. 2017, 89, 1531-1539.

Jordan P. et al., "Three-dimensional structure of cyanobacterial photosystem I at 2.5 A resolution", Nature, vol. 411, Jun. 21, pp. 909-917 (2001).

Jores K. et al., "Investigations on the structure of solid lipid nanoparticles (SLN) and oil-loaded solid lipid nanoparticles by photon correlation spectroscopy, field-flow fractionation and transmission electron microscopy", Journal of Controlled Release, vol. 95, Issue 2, pp. 217-227 (2004).

Kale et al., Continuous-flow dielectrophoretic trapping and patterning of colloidal particles in a ratchet microchannel. Journal of Micromechanics and Microengineering 2014, 24 (7) 6 pages.

Kang et al., Separation of mitochondria by flow field-flow fractionation for proteomic analysis. Analyst 2008, 133 (4), 505-515.

Kim et al., "Deterministic Ratchet for Sub-micrometer (Bio)particle Separation," Anal. Chem., 2018, 90 (7), pp. 4370-4379.

Kim et al., "Dynmanic Constriction Insulator-Based Dielectrophoresis for Particle Manipulation," 2016, 1 page.

Kissick D.J. et al., "Second-Order Nonlinear Optical Imaging of Chiral Crystals", Annual Review of Analytical Chemistry, vol. 4, pp. 419-437 (2011).

Kralj J.G. et al., "Continuous Dielectrophoretic Size-Based Particle Sorting", Analytical Chemistry, vol. 78, Issue 14, pp. 5019-5025 (2006).

Kung, Y-C. et al., "Tunable dielectrophoresis for sheathless 3D focusing", IEEE International Conference on Micro Electro Mechanical Systems (Estoril, Portugal, Jan. 18-22, 2015), 2015 (Date added to IEEE Xplore: Mar. 2015), pp. 196-199 <DOI:10.1109/MEMSYS.2015.7050920>.

Lapizco-Encinas B.H. et al., "Insulator-based dielectrophoresis for the selective concentration and separation of live bacteria in water", Electrophoresis, vol. 25, Issue 10-11, pp. 1695-1704 (2004).

Latham A.H. et al., "Capillary Magnetic Field Flow Fractionation and Analysis of Magnetic Nanoparticles", Analytical Chemistry, vol. 77, Issue 15, pp. 5055-5062 (2005).

Li et al., "Parallel mixing of photolithographically defined nanoliter volumes using elastomeric microvalve arrays", Electrophoresis, 26, 3758-3764 (2005).

Liao et al., "Nanoscale Molecular Traps and Dams for Ultrafast Protein Enrichment in High-Conductivity Buffers," J. Am. Chem. Soc. 2012, 134, 8742-8745.

Lin et al., Highly selective biomechanical separation of cancer cells from leukocytes using microfluidic ratchets and hydrodynamic concentrator. Biomicrofluidics 2013, 7 (3) ; 034114.

Loutherback et al., Deterministic Microfluidic Ratchet. Physical Review Letters 2009, 102, 045301.

Lundstrom K., "Structural genomics and drug discovery", Journal of Cellular and Molecular Medicine, vol. 11, Issue 2, pp. 224-238 (2007).

Luo et al., Insulator-based dielectrophoresis of mitochondria. Biomicrofluidics 2014, 8 (2), 021801.

Luo, J. H.; Muratore, K. A.; Arriaga, E. A.; Ros, A., Deterministic Absolute Negative Mobility for Micro- and Submicrometer Particles Induced in a Microfluidic Device. Analytical Chemistry 2016, 88 (11), 5920-5927.

Mafune, F, et al., "Microcrystal Delivery by Pulsed Liquid Droplet for Serial Femtosecond Crystallography", Acta Crystallographica Section D, Apr. 2016 [available online Mar. 2016], vol. 72, Part 4, pp. 520-523 <DOI:10.1107/S2059798316001480>.

(56) References Cited

OTHER PUBLICATIONS

Majewski P. et al., "Synthesis, Surface Modifications, and Size-Sorting of Mixed Nickel-Zinc Ferrite Colloidal Magnetic Nanoparticles", Chemistry: a European journal, vol. 14, Issue 26, pp. 7961-7968 (2008).
Mancuso, A. P., "The Single Particles, Clusters and Biomolecules and Serial Femtosecond Crystallography instrument of the European XFEL: initial installation", J. Synchrotron Radiation 2019, 26, 660-676.
Marquet et al., Rectified motion of colloids in asymmetrically structured channels. Physical Review Letters 2002, 88 (16) 168301.
Martinez-Duarte R. et al., "Microfabrication technologies in dielectrophoresis applications—A review", Electrophoresis, vol. 33, Issue 21, pp. 3110-3132 (2012).
Martinez-Lopez et al., "Characterization of electrokinetic mobility of microparticles in order to improve dielectrophoretic concentration," Anal. Bioanal. Chem. 2009, 394, 293-302.
Martin-Garcia, J. M., et al. "Serial Femtosecond Crystallography: A Revolution In Structural Biology," Arch. Biochem. Biophys. 2016, 602, 32-47.
Matias et al., Giant mitochondria and intramitochondrial inclusions in benign thyroid lesions. Ultrastruct Pathol 1991, 15 (3), 221-9.
McFaul et al., Cell separation based on size and deformability using microfluidic funnel ratchets. Lab on a Chip 2012, 12 (13), 2369-2376.
Michelsen et al., Isolation of Subcellular Organelles and Structures. Methods in Enzymology 2009, 463, 305-28.
Morgan et al., Separation of submicron bioparticles by dielectrophoresis. Biophysical Journal 1999, 77 (1), 516-525.
Muller T. et al., "A 3-D microelectrode system for handling and caging single cells and particles", Biosensors & Bioelectronics, vol. 14, Issue 3, pp. 247-256 (1999).
Nakano A. et al., "Tuning direct current streaming dielectrophoresis of proteins", Biomicrofluidics, vol. 6, Issue 3, pp. 34108 (2012).
Nakano et al., "Temporal and Spatial Temperature Measurement in Insulator-based Dielectrophoretic Devices," Analytical Chemistry (2014) 86, 6516-6524.
Nakano et al., Immunoglobulin G and bovine serum albumin streaming dielectrophoresis in a microfluidic device. Electrophoresis 2011, 32 (17), 2314-2322.
Navratil et al., Giant mitochondria do not fuse and exchange their contents with normal mitochondria. Exp Cell Res 2008, 314 (1), 164-72.
Nelson et al., "Three-dimensional-printed gas dynamic virtual nozzles for x-ray laser sample delivery". Optics Express, 2016, 24, 11515-11530.
Novak J P. et al., "Purification of Molecularly Bridged Metal Nanoparticle Arrays by Centrifugation and Size Exclusior Chromatography", Analytical Chemistry, vol. 73, Issue 23, pp. 5758-5761 (2001).
Ozuna-Chacon S. et al., "Performance characterization of an insulator-based dielectrophoretic microdevice", Electrophoresis, vol. 29, Issue 15, pp. 3115-3122 (2008).
Pamme N. et al., "Continuous sorting of magnetic cells via on-chip free-flow magnetophoresis", Lab on A Chip, vol. 6, Issue 8, pp. 974-980 (2006).
Pamme N. et al., "On-Chip Free-Flow Magnetophoresis: Continuous Flow Separation of Magnetic Particles and Agglomerates", Analytical Chemistry, vol. 76, Issue 24, pp. 7250-7256 (2004).
Papadimitriou et al., Giant mitochondria with paracrystalline inclusions in paraganglioma of the urinary bladder: correlation with mitochondrial abnormalities in paragangliomas of other sites. Ultrastruct Pathol 1994, 18(6), 559-64.
Pethig, Review Article-Dielectrophoresis: Status of the theory, technology, and applications. Biomicrofluidics 2010, 4 (2) 022811-1-022811-35.
Pohl H.A. et al., "Dielectrophoresis of Cells", Biophysical Journal, vol. 11, pp. 711-727 (1971).
Pohl H.A. et al., "Dielectrophoretic Force", J Theor. Biol., vol. 37, pp. 1-13 (1972).
Pohl, Dielectrophoresis : The Behavior of Neutral Matter in Nonuniform Electric Fields. Cambridge ; New York : Cambridge University Press 1978.
Pommer M.S. et al., "Dielectrophoretic separation of platelets from diluted whole blood in microfluidic channels", Electrophoresis, vol. 29, Issue 6, pp. 1213-1218 (2008).
Redecke L. et al., "Natively Inhibited Trypanosoma brucei Cathepsin B Structure Determined by Using an X-ray Laser", Science, vol. 339, Issue 6116, pp. 227-230 (2013).
Regtmeier et al., "Dielectrophoretic manipulation of DNA: Separation and polarizability," A. Anal. Chem. 2007, 79, 3925-3932.
Regtmeier et al., Acceleration of absolute negative mobility. Journal of Separation Science 2007, 30(10), 1461-1467.
Roessler, C. et al., "Acoustic Injectors for Drop-On-Demand Serial Femtosecond Crystallography", Structure, Apr. 2016 [available online Mar. 2016], vol. 24, No. 4, pp. 631-6410, S1-S19.
Ros et al., "Co-flow injection facilitates improved injection for MHz Crystallography," published Mar. 2, 2020, (2 pages).
Safarik et al., Magnetic techniques for the isolation and purification of proteins and peptides. Biomagn Res Technol 2004, 2, 7, 18 pages.
Salomon S. et al., "A dielectrophoretic continuous flow sorterusing integrated microelectrodes coupled to a channel cnstriction", Electrophoresis, vol. 32, Issue 12, pp. 1508-1514 (2011).
Schubert W.D. et al., "Photosystem I of Synechococcus elongatus at 4 A Resolution: Comprehensive Structure Analysis", Journal of Molecular Biology, vol. 272, Issue 5, pp. 741-769 (1997).
Shafiq et al., Giant mitochondria in human muscle with inclusions. Arch Neurol 1967, 17 (6), 666-71.
Spence J.C. et al., "X-ray lasers for structural and dynamic Biology", Rep Prog Phys, vol. 75, Issue 10, pp. 102601 (2012).
Srivastava S.K. et al., "A continuous DC-insulator dielectrophoretic sorter of microparticles", Journal of chromatography. A, vol. 1218, Issue 13, pp. 1780-1789 (2011).
Srivastava S.K. et al., "DC insulator dielectrophoretic applications in microdevice technology: a review", Analytical and Bioanalytical Chemistry, vol. 399, Issue 1, pp. 301-321 (2011).
Srivastava S.K. et al., "Direct current insulator-based dielectrophoretic characterization of erythrocytes: ABO-Rh human blood typing", Electrophoresis, vol. 32, Issue 18, pp. 2530-2540 (2011).
Sturm et al., Ratchets in hydrodynamic flow: more than waterwheels. Interface Focus 2014, 4 (6) 9 pages.
Sugiura, Y. et al., "Fabrication of Microfluidic Valves Using a Hydrogel Molding Method", Scientific Reports, Aug. 2015, vol. 5, No. 13375, 7 pages <DOI:10.1038/srep13375>.
Tang, S. et al., "Basic Microfluidic and Soft Lithographic Techniques", in Optofluidics: Fundamentals, Devices and Applications (Ed. Y. Fainmain), 2010, Ch. 2, pp. 7-31.
Thoenes et al., On matrix-rich giant mitochondria. Electron microscopic observations on tubular epithelium of the human kidney in the nephrotic syndrome. Z Zellforsch Mikrosk Anat 1966, 75 (2), 422-33.
Tice, J. et al., "A monolithic poly(dimethylsiloxane) electrostatic actuator for controlling integrated pneumatic microsystems", Sensors and Actuators A: Physical, Jul. 2013 (available online Mar. 2013), vol. 196, pp. 22-29 <DOI:10.1016/j.sna.2013.03.020>.
U.S. Appl. No. 15/930,239, filed May 12, 2020, Ros et al.
U.S. Appl. No. 15/930,313, filed May 12, 2020, Ros et al.
Unger et al., "Monolithic microfabricated valves and pumps by multilayer soft lithography," Science, 288, 113-16 (2000).
Vega et al., "Global and local instability of flow focusing: The influence of the geometry," Physics of Fluids, vol. 22, No. 6, p. 064105, Jun. 2010.
Vidal, C. et al., "Fabrication of Pneumatic Microvalves for PDMS Microfluidic Devices", International Congress of Mechanical Engineering (Gramado, Brazil, Nov. 15-20, 2009), 2009, 7 pages.
Viefhues M. et al., "Physisorbed surface coatings for poly(dimethylsiloxane) and quartz microfluidic devices", Analytical and Bioanalytical Chemistry, vol. 401, Issue 7, pp. 2113-2122 (2011).
Wampler R.E. et al., "Selective Detection of Protein Crystals by Second Harmonic Microscopy", Journal of the American Chemical Society, vol. 130, Issue 43, pp. 14076-14077 (2008).

(56) References Cited

OTHER PUBLICATIONS

Weierstall U. et al., "Injector for scattering measurements on fully solvated biospecies", Review of Scientific Instruments. vol. 83, Issue 3, pp. 035108 (2012).
Weierstall, U., et al. "Lipidic cubic phase injector facilitates membrane protein serial femtosecond crystallography," Nat. Commun. 2014, 5, 1, 3309.
Wiedorn, M., et al. "Megahertz Serial Crystallography," Nat. Commun. 2018, 9, 1, 4025.
Yamada et al. "Differential Permeabilization Effects of Ca2+ and Valinomycin on the Inner and Outer Mitochondrial Membranes as Revealed by Proteomics Analysis of Proteins Released from Mitochondria," Mol. Cell Proteomics, 2009, 8, 1265-1277.
Yang et al., "Toward Analysis of Proteins in Single Cells: A Quantitative Approach Employing Isobaric Tags with MALDI Mass Spectrometry Realized with a Microfluidic Platform," Anal. Chem. 2016, 88, 6672-6679.
Yang et al., High Speed Size Sorting of Subcellular Organelles by Flow Field-Flow Fractionation. Analytical Chemistry 2015, 87 (12), 6342-6348.
Yang J. et al., "Size sorting of Au and Pt nanoparticles from arbitrary particle size distributions", Analytica Chimica Acta, vol. 546, Issue 2, pp. 133-138 (2005).
Yates et al., "Proteomics of organelles and large cellular structures," Nat. Rev. Mol. Cell Biol. 2005, 6, 702-714.
Zhu J. et al., Dielectrophoretic focusing of particles in a microchannel constriction using DC-biased AC flectric fields, Electrophoresis, vol. 30, Issue 15 pp. 2668-2675 (2009).

\* cited by examiner

MODULAR 3-D PRINTED DEVICES FOR SAMPLE DELIVERY AND METHOD

CROSS-REFERENCE TO RELATED APPLICATIONS

This application claims priority to U.S. Provisional Application No. 63/090,031, filed Oct. 9, 2020, the entire contents of which are incorporated herein by reference.

FIELD

The present application relates to modular microfluidic devices.

BACKGROUND

Microfluidic devices are commonly used, for example, in serial crystallography apparatuses and with serial crystallography experiments.

SUMMARY

In accordance with one embodiment, a microfluidic device for use in a serial crystallography apparatus includes a nozzle having an inlet, an outlet, and a first snap engagement feature. The microfluidic device further includes a fiber holder having an outlet and a second snap engagement feature. The first snap engagement feature is configured to engage the second snap engagement feature to removably couple the nozzle to the fiber holder. The outlet of the fiber holder is aligned with the inlet of the nozzle when the first snap engagement feature is coupled to the second snap engagement feature.

In accordance with another embodiment, a microfluidic device for use in a serial crystallography apparatus includes a droplet generator having an outlet and a first snap engagement feature. The microfluidic apparatus additionally includes a fiber holder having an inlet and a second snap engagement feature. The first snap engagement feature is configured to engage the second snap engagement feature to removably couple the droplet generator to the fiber holder, and the inlet of the fiber holder is configured to be aligned with the outlet of the droplet generator when the first snap engagement feature is coupled to the second snap engagement feature.

In accordance with another embodiment, a microfluidic device for use in a serial crystallography apparatus includes a droplet generator, a nozzle configured to receive a fluid from the droplet generator, and a fiber holder configured to support an optical fiber. The fiber holder has a flow channel extending from the droplet generator to the nozzle. The flow channel is configured to provide the fluid from the droplet generator to the nozzle. The droplet generator, nozzle, and fiber holder are removably coupled to one another.

DETAILED DESCRIPTION

Before any embodiments of the microfluidic device are explained in detail, it is to be understood that the microfluidic device is not limited in its application to the details of construction and the arrangement of components set forth in the following description or illustrated in the following drawings. The microfluidic device is capable of other embodiments and of being practiced or of being carried out in various ways.

FIGS. 1-4 illustrate a microfluidic device 10 having a nozzle 12, a fiber holder 14, and a droplet generator 16. The microfluidic device 10 is a small device, with the entire assembly shown in FIGS. 1-2 being on the order of millimeters in width, height, and depth. For example, the nozzle 12 is approximately 1 millimeter in length and diameter, the fiber holder 14 is approximately 5 millimeters in length and 2 millimeters in width, and the droplet generator 16 is approximately 2 millimeters in width and in length. Other embodiments include different sizes and shapes than that illustrated for each of the nozzle 12, fiber holder 14, and droplet generator 16.

The microfluidic device 10 is operable, for example, in a serial crystallography apparatus and experiment, where droplets are created through an electrical stimulus synchronized with a pulsed laser source (here an X-ray free electron laser (XFEL)). The microfluidic device 10 functions to synchronize the delivery of sample droplets with the laser pulse to carry out serial crystallography. The microfluidic device 10 may additionally be used with other experiments and may be modified to suit the functionality required for these additional experiments. A non-exhaustive list of functionalities of the microfluidic device 10 may include microfluidic mixers, passive droplet generators, electrically stimulated droplet generators, and nozzles jetting sample.

Figure 1:
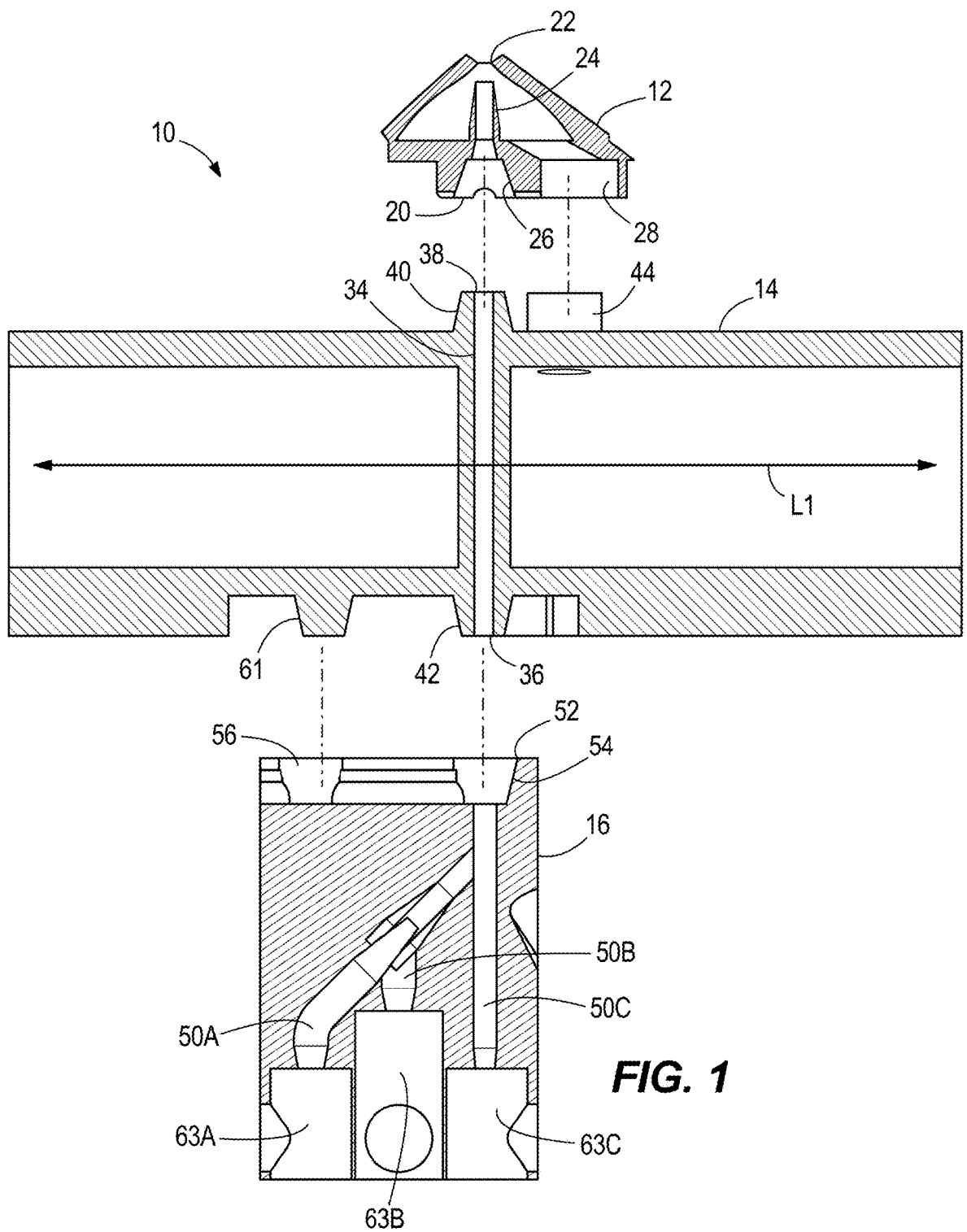
FIG. 1 is an exploded view of a microfluidic device.
Figure 2:
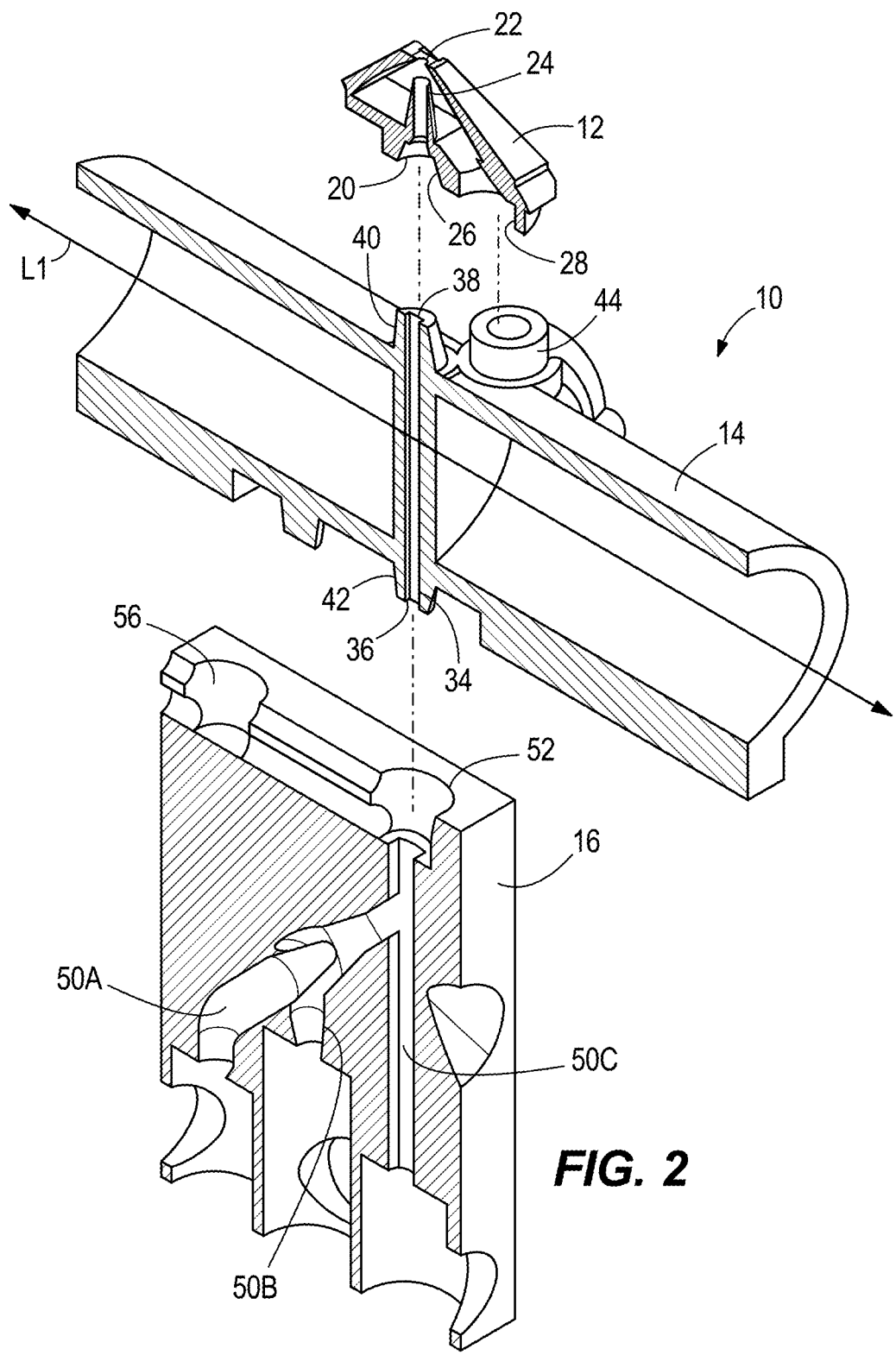
FIG. 2 is an isometric exploded view of the microfluidic device.

With reference to FIGS. 1 and 2, in the illustrated embodiment the nozzle 12 includes a nozzle inlet 20, a nozzle outlet 22, and a tube 24 defining a passageway therebetween. The nozzle 12 serves as a gas dynamic virtual nozzle. The tube 24 directs fluid from the nozzle inlet 20 to the nozzle outlet 22 along an axis. The nozzle 12 includes an alignment cavity 26 at the nozzle inlet 20 to facilitate alignment of the nozzle 12 with the fiber holder 14. As shown in FIGS. 1-2, the alignment cavity 26 includes a circular cross-section about the axis and is trapezoidal as viewed perpendicular to the axis, tapering down in size from the nozzle inlet 20 toward the tube 24 and nozzle outlet 22. The nozzle 12 further includes an attachment feature in the form of a cavity 28 formed in the body of the nozzle 12. The attachment feature is sized and shaped to couple (e.g., releasably couple) the nozzle 12 to the fiber holder 14. In the illustrated embodiment the attachment feature cavity 28 is a cylindrical cavity having a circular cross-section. The alignment cavity 26 and the attachment feature cavity 28 are shown having circular cross-sections, though other shapes (rectangular, triangular, polygonal, etc.) could be utilized.

Figure 4:
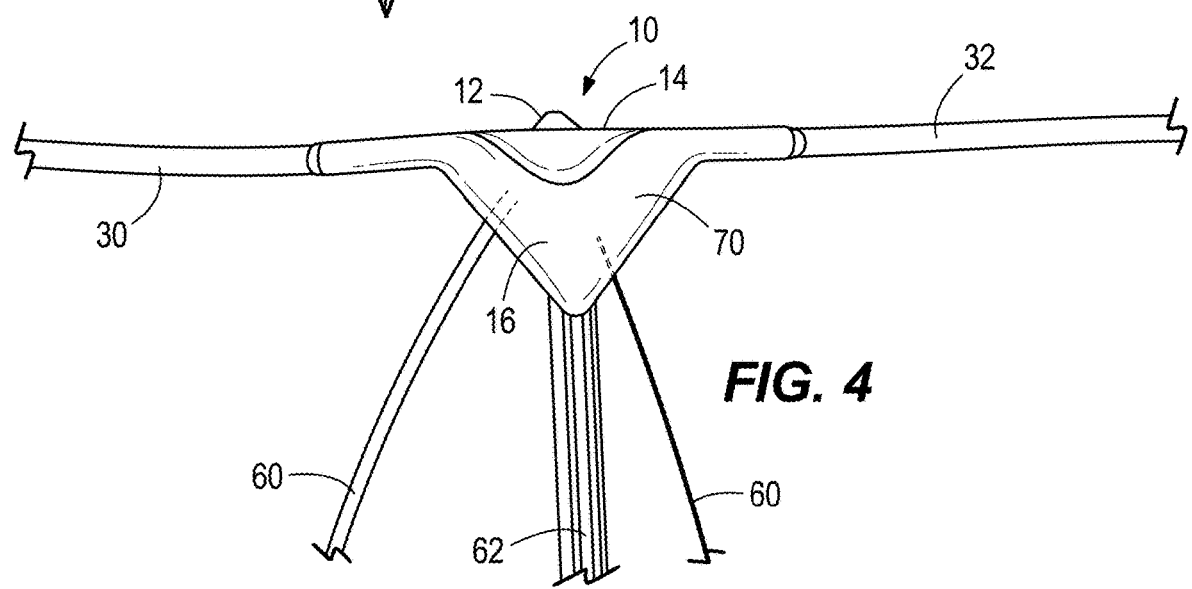
FIG. 4 is a perspective view of the microfluidic device, assembled with optical fibers.

With continued reference to FIGS. 1 and 2, the fiber holder 14 has a tubular body, is generally hollow, and extends in a longitudinal direction L1 transverse (e.g., perpendicular) to the axis and fluid flow direction through the nozzle 12. As shown in FIG. 4, optical fibers 30, 32 may be inserted into opposing ends of the fiber holder 14. With reference in FIGS. 1-2, the fiber holder 14 further includes a flow channel 34 that extends transverse to the longitudinal direction of the fiber holder 14 and is axially aligned with the inlet 20 of the nozzle 12. The flow channel 34 is a tube that extends through the center of the tubular body of the fiber holder 14. The flow channel 34 includes an inlet 36 and includes an outlet 38 that is diametrically opposed to the inlet 36 on the tubular body of the fiber holder 14. The outlet 38 is formed in a protrusion 40 (e.g., boss) extending radially outward from the tubular body. The protrusion 40 is sized and shaped to fit within the alignment cavity 26 of the nozzle 12. The inlet 36 is formed in a similar protrusion 42 (e.g., boss) that is diametrically opposed to the protrusion 40 and is sized and shaped to couple to a portion of the droplet generator 16, as described in greater detail below.

The fiber holder 14 additionally includes an attachment feature in the form of a protrusion 44 (e.g., boss) that interacts with the cavity 28 of the nozzle 12. When the protrusion 44 is inserted into the cavity 28, the outlet protrusion 40 is likewise inserted into the alignment cavity 26 and the fiber holder 14 is coupled to the nozzle 12. The protrusion 44 and the cavity 28 interlock with one another (e.g., via a snap-fit or interference fit) such that the fiber holder 14 is coupled to the nozzle 12 merely via the interlocking connection and is operable without further securing (i.e., the arrangement does not require connecting capillaries between the nozzle 12, fiber holder 14, and droplet generator 16). A threshold axial force greater than the operational forces felt during normal operation may be required to overcome the interlocking connection and separate the fiber holder 14 from the nozzle 12.

Figure 3:
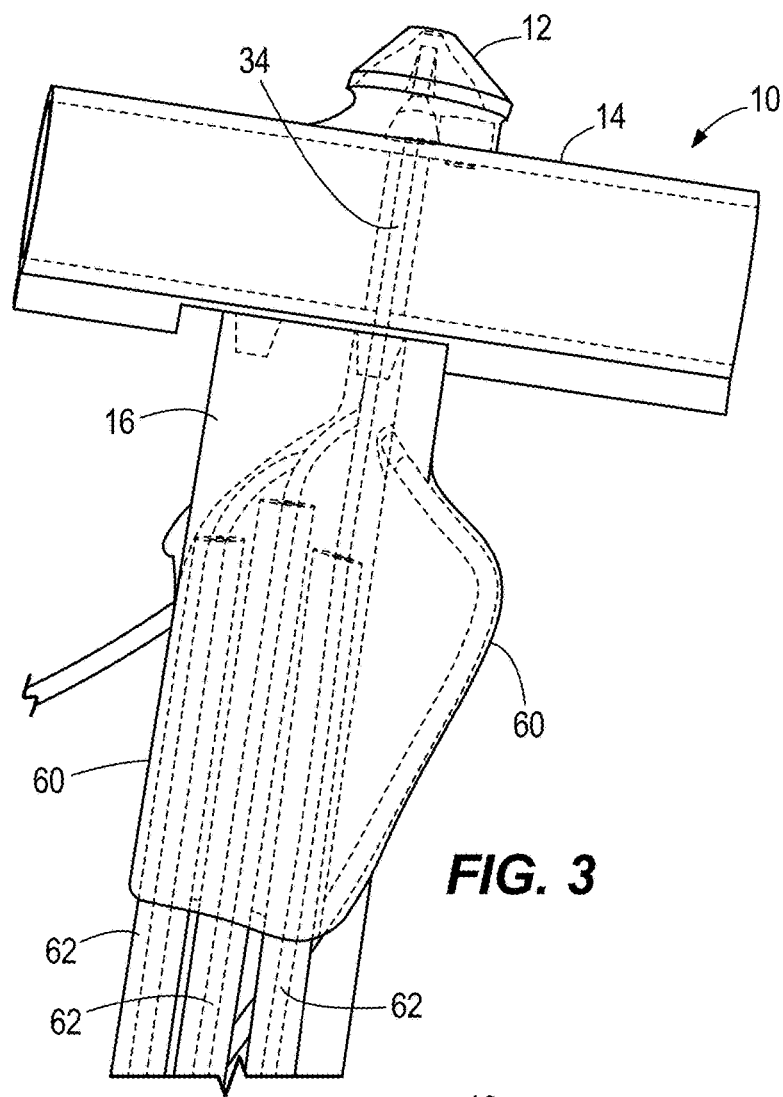
FIG. 3 is a perspective view of the microfluidic device, assembled with electrodes and fluidic capillaries.
Figure 5:
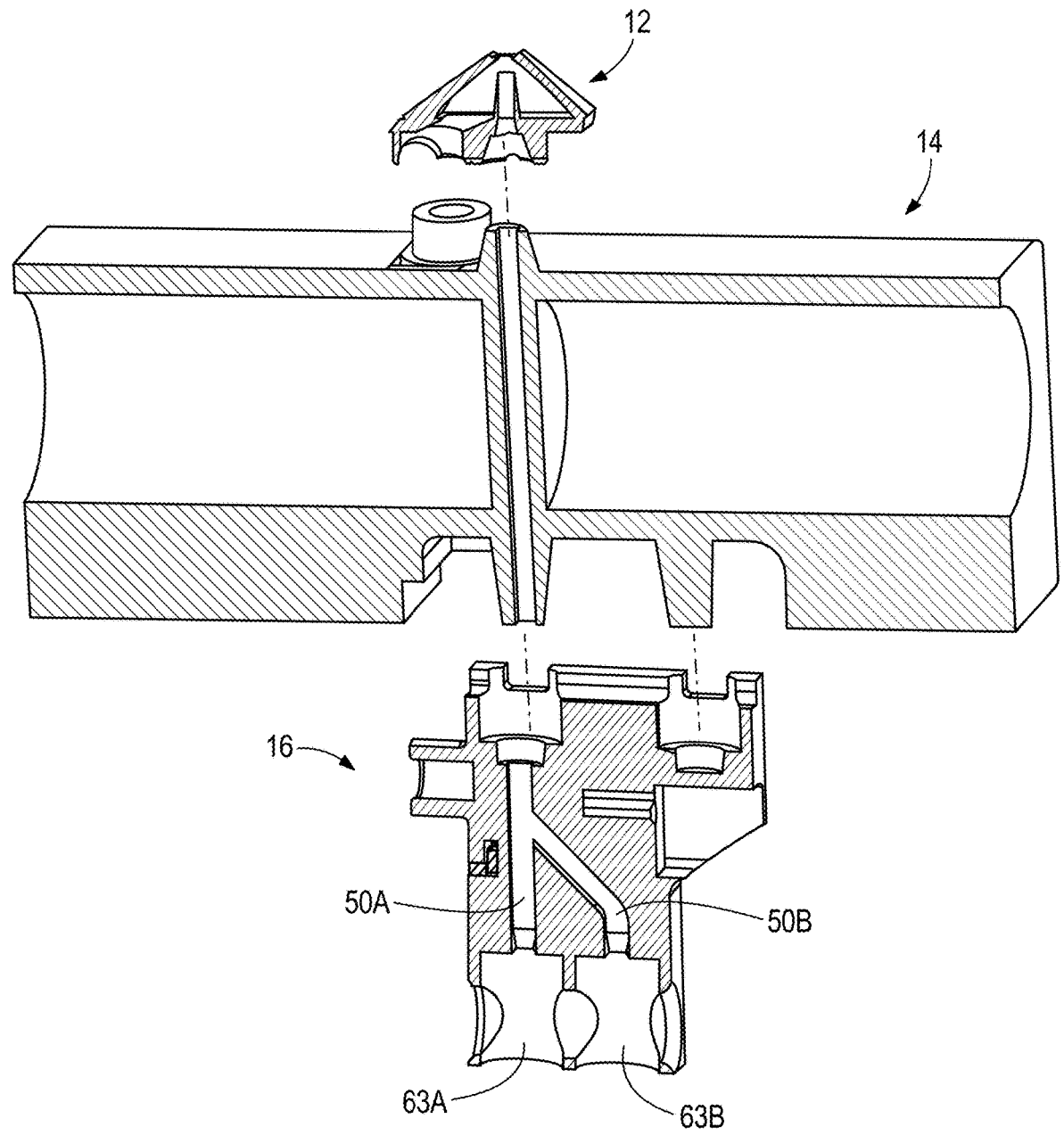
FIG. 5 is an exploded view of the microfluidic device, illustrating an alternative embodiment of a droplet generator.

With continued reference to FIGS. 1 and 2, in the illustrated embodiment the droplet generator 16 is a rectangular prism and includes a plurality of intersecting internal passageways 50A, 50B, 50C that direct fluid toward an outlet 52 of the droplet generator 16 and individually may provide various functions based on the functionality of the microfluidic device 10. As shown in FIGS. 3-4, electrodes 60 may be integrated into the microfluidic device 10 and fluidic capillaries 62 may be attached to the droplet generator 16. In the illustrated embodiment, three capillaries 62 are provided, each of which extends into an enlarged receiving portion 63A, 63B, 63C of one of the internal passageways 50A, 50B, 50C. The electrodes 60 near the droplet generator 16 assist in electrical stimulation of the droplet release and synchronization of the droplet delivery to an XFEL (or another pulsed light source). Other embodiments include different numbers and arrangements of internal passageways. For example, and with reference to FIG. 5, in some embodiments the droplet generator 16 includes just two internal passageways 50A, 50B having respective receiving portions 63A, 63B.

With continued reference to FIGS. 1 and 2, the droplet generator 16 includes an alignment cavity 54 at the outlet 52 to facilitate alignment of the droplet generator 16 with the fiber holder 14. The alignment cavity 54 is sized and shaped similar to the alignment cavity 26 of the nozzle 12. If the protrusions 40, 42 are instead different sizes or shapes, the alignment cavity 54 may be dissimilar from the alignment cavity 26 to account for the differences in size and shape of the protrusions 40, 42. The droplet generator 16 further includes an attachment feature in the form of a cavity 56. The cavity 56 interlocks with a second attachment feature in the form of a protrusion 61 (e.g., boss) of the fiber holder 14, similar to the connection between the protrusion 44 and cavity 28 described above. As such, the nozzle 12 and droplet generator 16 are each removably coupled to the fiber holder 14 via the interlocking connections. While this method of interlocking the nozzle 12, the fiber holder 14, and the droplet generator 16 does not require additional fastening means, it can be supplemented with, for example, adhesive 70, as shown in FIG. 4, or other fastening structures. The adhesive 70 may additionally fix the optical fibers 30, 32, electrodes 60, and/or fluidic capillaries 62 relative to the microfluidic device 10.

The attachment features 28, 44, 56, 61 may be snap engagement features that engage one another via a snap fit such as a friction fit or interference fit. Some flexing of the attachment features 28, 44, 56, 61 (e.g., at the circumference of the more elastic piece) may occur when coupling the nozzle 12, the fiber holder 14, and the droplet generator 16 together. Additionally, the attachment features 28, 44, 56, 61 may include a detent for added retention. The attachment features 28, 44, 56, 61 provide coupling between the nozzle 12, the fiber holder 14, and the droplet generator 16 without the need for fasteners, threads or other coupling mechanisms. Additionally, while the attachment features 44 and 61 are described as protrusions and the attachment features 28 and 56 are described as cavities, it is understood that in other embodiments this could be reversed, such that one or both of the attachment features 44, 61 are cavities, and such that one or both of the attachment features 28, 56 are protrusions.

In some embodiments, the nozzle 12, the fiber holder 14, and/or the droplet generator 16 is a 3D-printed structures manufactured via 3D-printing (additive manufacturing), which printing is capable of forming the complex structures, including internal structures such as channels with a high resolution and level of precision that provides the functionality of the interlocking (e.g., snap-fit) attachment features described above, even with the scale of the nozzle 12, the fiber holder 14, and the droplet generator 16, being on the order of millimeters. Using 3-D printing increases the resolution of the finished parts, thereby reducing waste of the sample fluid. It additionally permits for the rapid formation of replacement parts in the event of a part failure during use, which decreases the downtime of the experiment. Further, the use of 3D-printing provides manufacturing of a more compact design, allowing the droplet generator 16 to be located closer to the nozzle 12, thereby creating more reproducibility and stability in the droplet generation frequency and triggering.

Microfluidic devices 10 such as those described herein can be used to serve multiple functions relevant toward separations and droplet generation. These microfluidic devices 10 can generate aqueous droplets in an oil phase for sample delivery, and/or can mix a sample with a substrate for "mix-and-inject" crystallography prior to the droplet generation. The microfluid devices 10 also have the capability to detect droplets (or any other analyte that can be detected through transmission differences with adequate fiber optics in the fiber holder 14). The microfluidic devices 10 may be 3-D printed (i.e., using additive manufacturing) such that each component can be easily removed and replaced. Additionally, and as described above, the components (e.g., the nozzle 12, the fiber holder 14, and the droplet generator 16) may be modular, having a snap-attachment feature to quickly attach to and detach from one another. The ability to quickly replace faulty parts increases the effectiveness of the experiments.

Figure 6:
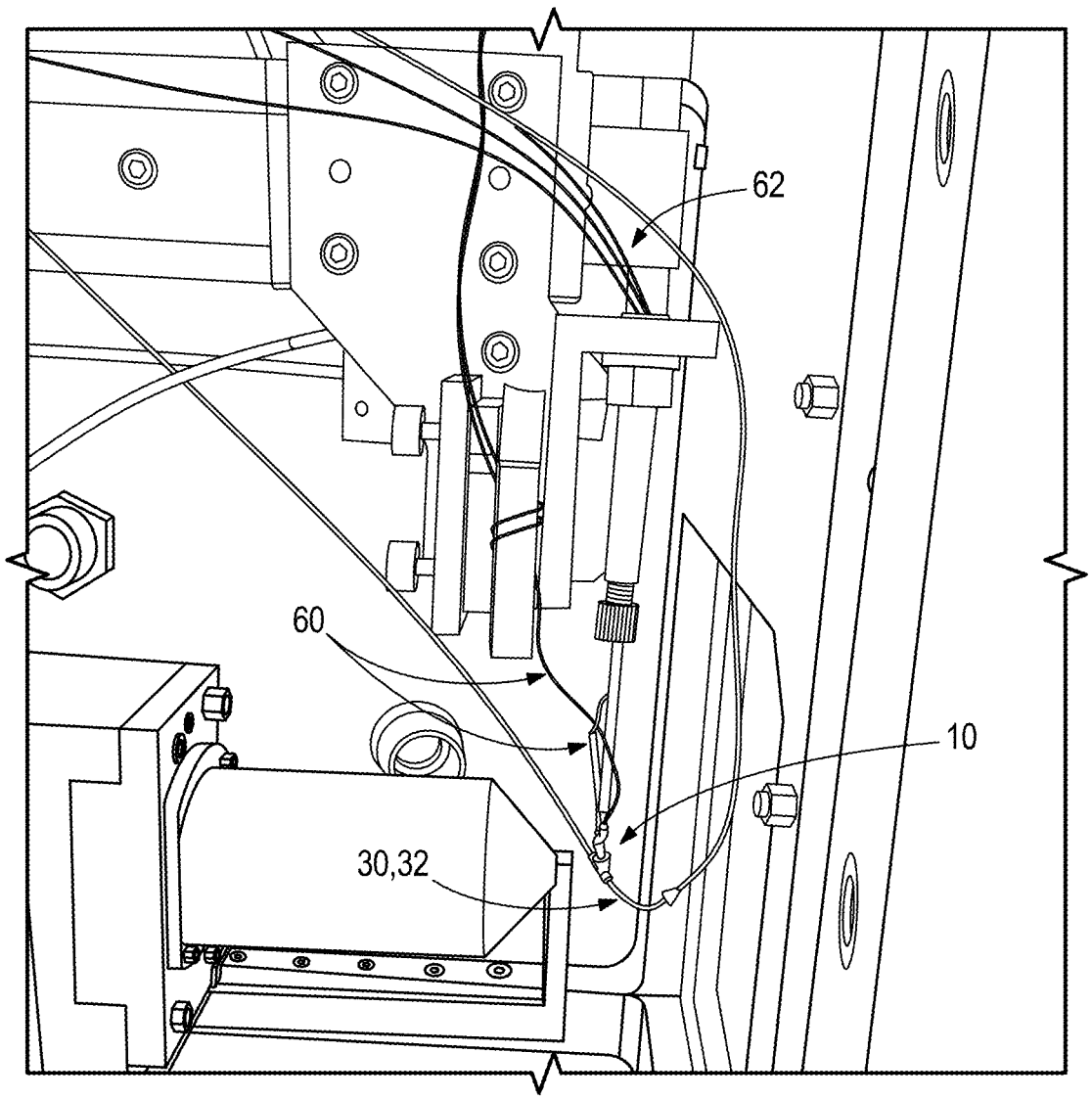
FIG. 6 is a perspective view of an experimental setup that includes the microfluidic device.
Figure 7:
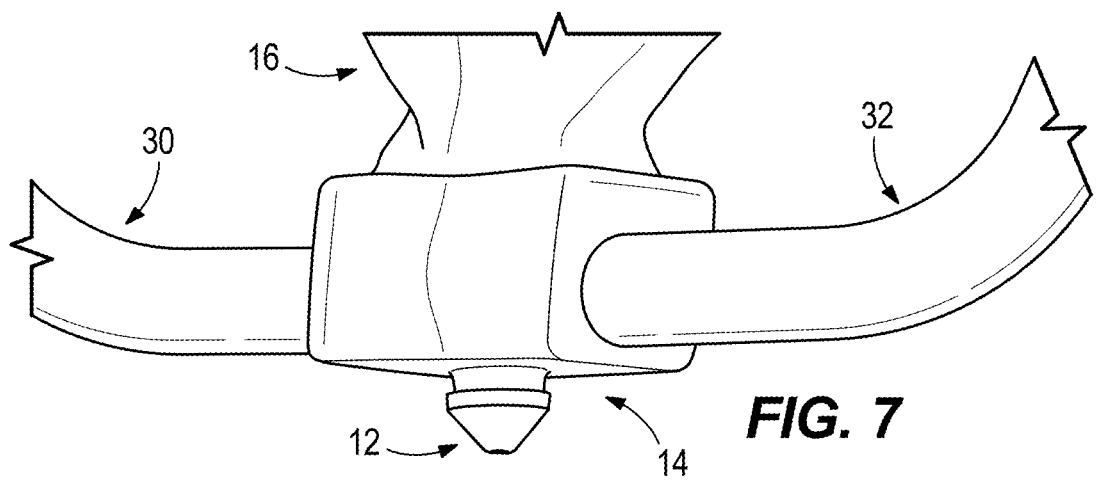
FIG. 7 is a partial view of the microfluidic device.
Figure 8:
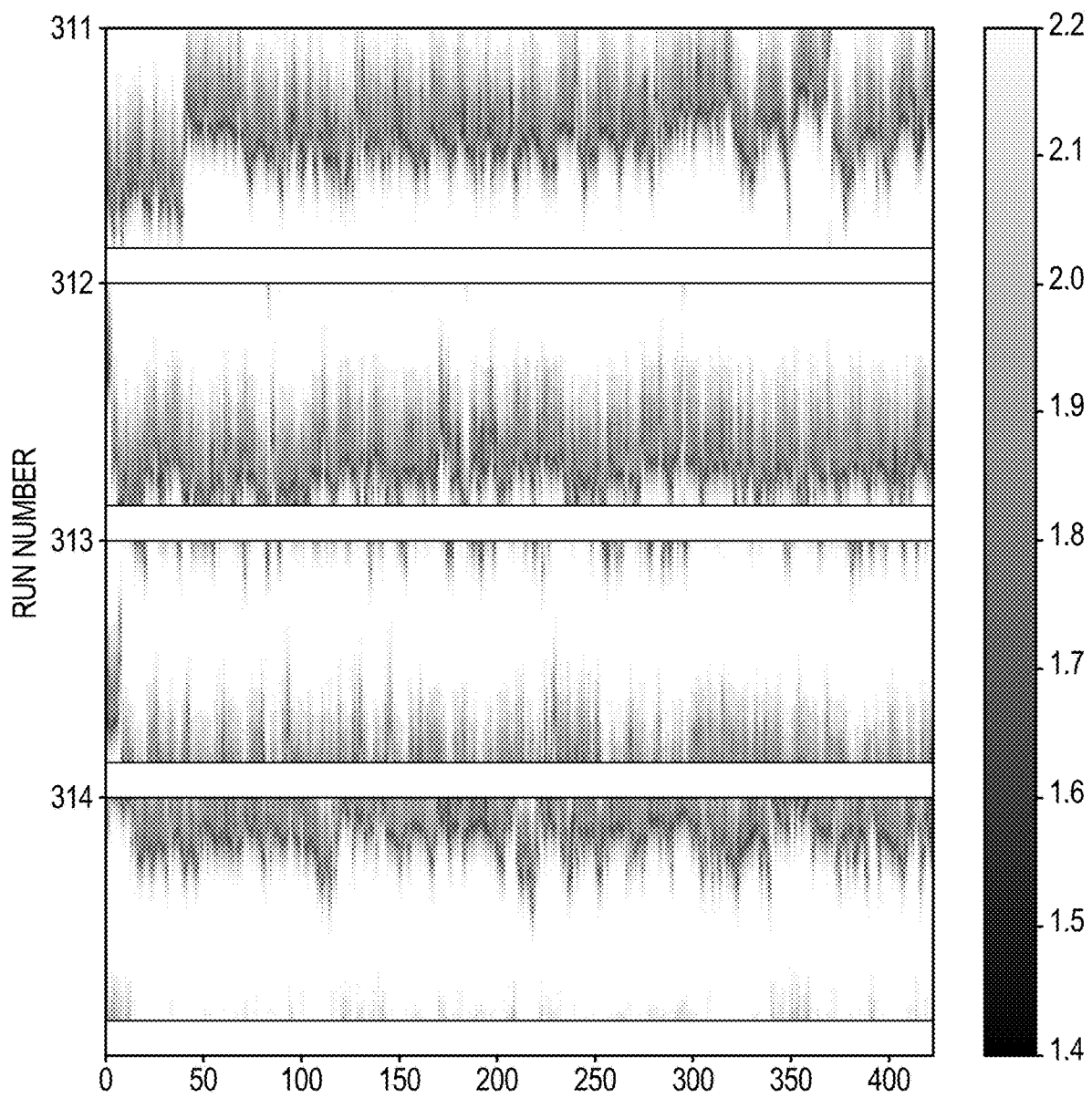
FIGS. 8-10 are graphs illustrating use of the microfluidic device.
Figure 9:
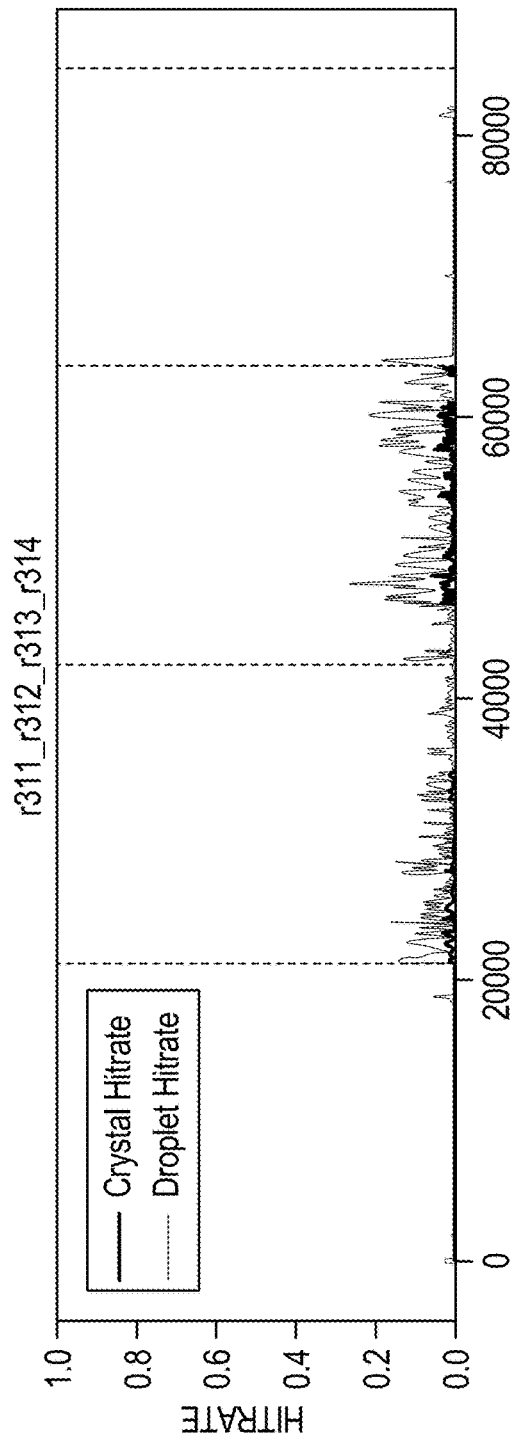
Figure 10:
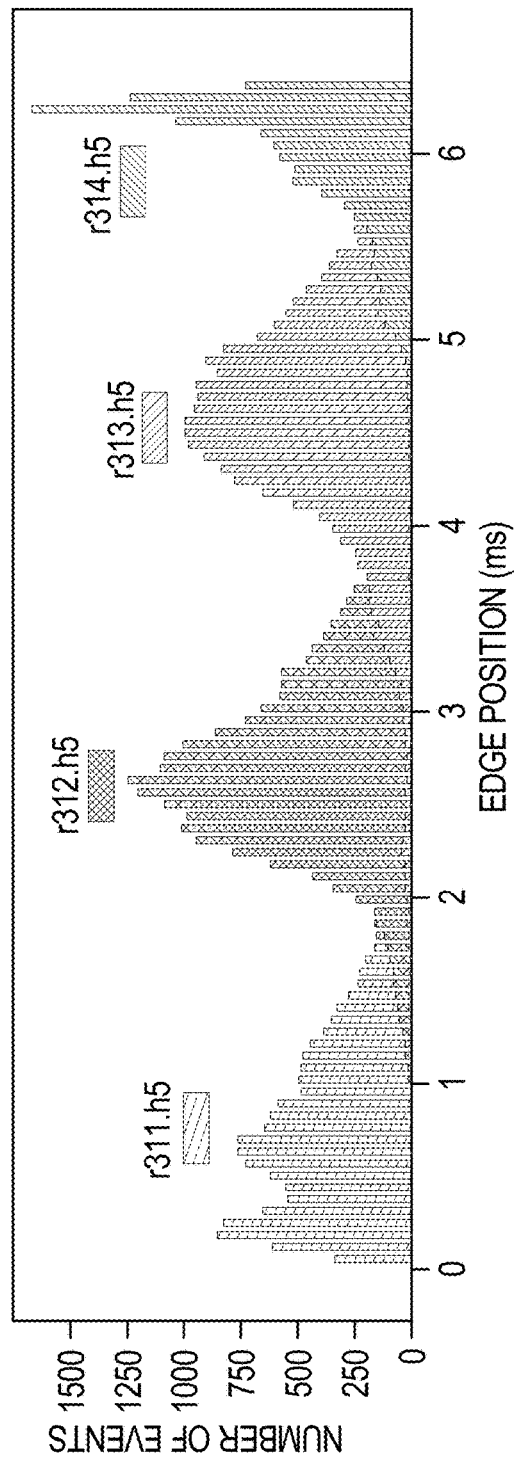

With reference to FIGS. 6 and 7, an experimental setup may include the microfluidic device 10, the optical fibers 30, 32 coupled to the fiber holder 14 of the microfluidic device 10, the electrodes 60 coupled to the microfluidic device 10, and the fluidic capillaries 62 coupled to the droplet generator 16 of the microfluidic device 10. With reference to FIGS. 8-10, the microfluidic device 10 may create droplets, detect the frequency and phase of the droplets, and inject the droplets from the nozzle 12. With a complex electronic feedback system, the phasing of the droplets from the nozzle 12 may be synchronized with the pulsing of an XFEL. Due to the geometry of the microfluidic device 10, the synchronization may be tuned in. FIG. 8 illustrates an example of shifting of the droplet about the 8 ms period between XFEL pulses during one such experiment. FIGS. 9 and 10 illustrate tuned synchronization of the droplets with the XFEL. For example, in FIG. 9, when the droplet edge target was 3 ms or 5 ms, the best crystal or droplet hit rate correlation occurred for the experiment. FIG. 10 illustrates the detected edge histogram for each programmed edge delay (1 ms, 3 ms, 5 ms, 7 ms).

Various features and advantages of the microfluidic device 10 are set forth in the accompanying drawings.

Although certain aspects have been described in detail with reference to certain preferred embodiments, variations and modifications exist within the scope and spirit of one or more independent aspects as described.

The invention claimed is:

1. A microfluidic device for use in a serial crystallography apparatus, the microfluidic device comprising:
   a nozzle having an inlet, an outlet, and a first snap engagement feature; and
   a fiber holder having an outlet and a second snap engagement feature, wherein the first snap engagement feature is configured to engage the second snap engagement feature to removably couple the nozzle to the fiber holder, and wherein the outlet of the fiber holder is configured to be aligned with the inlet of the nozzle when the first snap engagement feature is coupled to the second snap engagement feature.

2. The microfluidic device of claim 1, wherein the nozzle and the fiber holder are each a 3D-printed structure.

3. The microfluidic device of claim 1, wherein the nozzle has a body defining a cavity, wherein the first snap engagement feature is the cavity.

4. The microfluidic device of claim 3, wherein the fiber holder includes a protrusion, wherein the second snap engagement feature is the protrusion.

5. The microfluidic device of claim 4, wherein the cavity is a first cavity and the protrusion is a first protrusion, wherein the nozzle additionally includes a second cavity and the fiber holder additionally includes a second protrusion, wherein the second cavity is configured to receive the second protrusion and is an alignment cavity configured to align the nozzle with the fiber holder.

6. The microfluidic device of claim 1, wherein the nozzle includes a tube defining a passageway between the inlet of the nozzle and the outlet of the nozzle.

7. The microfluidic device of claim 6, wherein the nozzle includes an alignment cavity at the nozzle inlet to facilitate alignment of the nozzle with the fiber holder.

8. The microfluidic device of claim 1, wherein the nozzle includes a tube configured to direct fluid along a first direction with the nozzle, wherein the fiber holder includes a tubular body that extends in a longitudinal direction that is transverse to the first direction.

9. The microfluidic device of claim 1, wherein the fiber holder includes a tubular body that extends in a longitudinal direction and a flow channel that extends within the tubular body along a direction that is transverse to the longitudinal direction.

10. The microfluidic device of claim 9, wherein the flow channel is configured to be axially aligned with the inlet of the nozzle.

11. The microfluidic device of claim 1, further comprising a droplet generator configured to be coupled to the fiber holder.

12. The microfluidic device of claim 11, wherein the droplet generator is a 3D-printed structure.

13. A microfluidic device for use in a serial crystallography apparatus, the microfluidic device comprising:
   a droplet generator having an outlet and a first snap engagement feature; and
   a fiber holder having an inlet and a second snap engagement feature, wherein the first snap engagement feature is configured to engage the second snap engagement feature to removably couple the droplet generator to the fiber holder, and wherein the inlet of the fiber holder is configured to be aligned with the outlet of the droplet generator when the first snap engagement feature is coupled to the second snap engagement feature.

14. The microfluidic device of claim 13, wherein the droplet generator and the fiber holder are each a 3D-printed structure.

15. The microfluidic device of claim 13, wherein the droplet generator includes a cavity, wherein the cavity is the first snap engagement feature.

16. The microfluidic device of claim 15, wherein the fiber holder includes a protrusion, wherein the protrusion is the second snap engagement feature.

17. The microfluidic device of claim 16, wherein the cavity is a first cavity and the protrusion is a first protrusion, wherein the droplet generator additionally includes a second cavity, and the fiber holder additionally includes a second protrusion, wherein the second cavity is configured to receive the second protrusion and is an alignment cavity configured to align the droplet generator with the fiber holder.

18. The microfluidic device of claim 13, wherein the droplet generator includes a plurality of internal passageways.

19. A microfluidic device for use in a serial crystallography apparatus, the microfluidic device comprising:
   a droplet generator;
   a nozzle configured to receive a fluid from the droplet generator; and
   a fiber holder configured to support an optical fiber, the fiber holder having a flow channel extending from the droplet generator to the nozzle, the flow channel configured to provide the fluid from the droplet generator to the nozzle,
   wherein the droplet generator, the nozzle, and the fiber holder are removably coupled to one another.

20. A method of assembling the microfluidic device of claim 19 for use in a serial crystallography apparatus, the method comprising:
   aligning an outlet of the fiber holder with an inlet of the nozzle; and
   subsequently coupling the fiber holder to the nozzle via a snap engagement feature.

* * * * *